United States Patent [19]
Glaser et al.
[11] 4,297,632
[45] Oct. 27, 1981

[54] DEVICE FOR MONITORING LAMP FAILURE IN AIRPORT NAVIGATION LIGHTING

[75] Inventors: Helmut Glaser, Forchheim; Ludwig Schick, Erlangen, both of Fed. Rep. of Germany

[73] Assignee: Siemens Aktiengesellschaft, Berlin & Munich, Fed. Rep. of Germany

[21] Appl. No.: 52,843

[22] Filed: Jun. 28, 1979

[30] Foreign Application Priority Data

Jul. 3, 1978 [DE] Fed. Rep. of Germany ....... 2829135

[51] Int. Cl.³ .................. G01R 31/02
[52] U.S. Cl. .................. 324/51; 324/133
[58] Field of Search .................. 324/51, 52, 53, 133

[56] References Cited

U.S. PATENT DOCUMENTS

| | | | |
|---|---|---|---|
| 4,013,947 | 3/1977 | Arai | 324/51 |
| 4,019,128 | 4/1977 | Chesbowski | 324/51 |
| 4,037,220 | 7/1977 | Beyersdorf | 324/51 |

*Primary Examiner*—Michael J. Tokar
*Attorney, Agent, or Firm*—Kenyon & Kenyon

[57] ABSTRACT

A device for monitoring lamp failure in an airport landing-light system in which a first sample-and-hold memory picks up the value of the current flowing in the circuit and a second sample-and-hold memory picks up the value of the voltage at the instant the current reaches the extreme value. In the time interval between current value extremes, a determination of failed lamps is made.

6 Claims, 4 Drawing Figures

DEVICE FOR MONITORING LAMP FAILURE IN AIRPORT NAVIGATION LIGHTING

BACKGROUND OF THE INVENTION

1. Field of the Invention

This invention relates to a monitoring device for lamp failure in airport navigation lighting, wherein the lamps are supplied via current transformers which are connected in series on the primary side to the secondary side of a high-voltage transformer which is connected on the primary side, via a constant-current regulator, to an AC voltage system. More particularly, the primary current of the current transformers is measured via a current measuring transformer and the voltage is measured via a voltage measuring transformer on the primary side of the high-voltage transformer and the output signals are fed to a monitoring device.

2. Description of the Prior Art

In airport landing-light systems it is necessary to monitor the lamps for failures due to broken helices, line breaks, or short circuits and to indicate the percentage of failed lamps. The voltage $U_K$ of the lamp circuit is given by $$U_K = Ri + L_K di/dt.$$

The inductance $L_K$ includes here all the inductances of the circuit (such as the inductance of the high-voltage transformer, the inductance of the current transformer, and the line inductance). A low-cost way of making the measurement is based on the fact that at the instant of the current maximum, the derivative of the current with respect to time is $di/dt=0$, so that at this instant, the monitored circuit behaves like a purely resitive circuit. A low-cost measurement is therefore reduced to the determination of current and voltage to ascertain the ohmic resistance in the circuit at the instant of the current maximum. For a given brightness level, this ohmic resistance is a constant value, since the r.m.s. value of the current is kept constant by means of the constant-current regulator arranged in the primary circuit of the high-voltage transformer. Therefore, by measuring the voltage and the current at the instant of current extreme, the resistance of the monitored circuit and any change in this value can be determined. Conclusions as to the percentage of failed lamps can be drawn from a change in this value.

In a commercially available monitoring device, the output signals of the current measuring transformer and of the voltage measuring transformer are each fed to a proportional amplifier and subtracted from each other at a summing point. A signal voltage is generated from the output signal of the proportional amplifier associated with the current measuring transformer which is fed, together with the voltage produced at the summing point, via a peak-value former, a pulse-width control, and a signal voltage generator, to an analog switch. The analog switch is always switched into conduction for the duration of the signal voltage, so that the voltage present at the summing point can be fed to a time-delay stage following the analog switch. The output signal of the time-delay stage is fed to a limit indicator and to an indicating instrument connected in parallel thereto so that the number of failed lamps can be determined and a protective measure initiated if a certain maximum number is exceeded. The output signal of the time-delay stage is a measure of the number of failed lamps, i.e., the value of the output signal is zero if the load circuit is intact. Through cooperation of the peak-value former, the pulse width control and the signal voltage generator, a pulse-shaped voltage, having a pulse width which is inversely proportional to the maximum value of the current, is generated at the instant of each current maximum.

This known monitoring device gives reliable indications for only one brightness level and requires very elaborate adjustments.

It is an object of the invention to develop a monitoring device of the type mentioned at the outset which requires less adjusting effort while employing a simplified circuit and which can easily be used with different brightness levels due to the simple adjustment requirements.

SUMMARY OF THE INVENTION

According to the present invention, this problem is solved in an apparatus in which:

(a) The output signal of the current measuring transformer is fed to a first sample-and-hold (instantaneous-value) memory and the output signal of the voltage measuring transformer is fed to a second sample-and-hold (instantaneous-value) memory;

(b) the sample-and-hold memories are briefly switched on simultaneously when activated by an extreme-value detector;

(c) the first sample-and-hold memory is followed by a first proportional amplifier;

(d) the difference between the output signals of the second sample-and-hold memory and of the first proportional amplifier is fed to a second proportional amplifier; and (e) a divider, which is driven on the input side by the output signals of the first and the second proportional amplifier feeds a limit indicator.

At the instant of the current extreme, the actual current value as well as also the actual voltage value are picked up by the sample-and-hold memories. In the following time interval and until the next extreme of the current occurs, the percentage of failed lamps can be determined in the monitoring device.

An advantageous method of setting the zero point of the indicating instrument of the monitoring device for different brightness levels of the lamps is to adjust the gain of the first proportional amplifier so that for each brightness level, the difference of the output signals of the second instantaneous-value memory and the first proportional amplifier is zero when the lamps are intact; i.e., the input signal to the second proportional amplifier vanishes when the lamps are intact, as can be seen from a zero reading of the indicating instrument.

By varying the gain of the second proportional amplifier, the signal present at the indicating instrument and at the limit indicator can be adjusted to the sensitivity of these elements and a calibration can be performed.

The extreme-value detector can be designed as a maximum-value detector. Thus, only one pickup is made by the monitoring device in each period of the feeding line voltage. However, this is completely sufficient.

In a preferred embodiment, the maximum-value detector comprises, on the input side, a differentiating stage and a limit indicator connected in parallel, the output signals of which are conjunctively linked, and fed to a null-voltage detector. The output signal of null-voltage detector switches on the sample-and-hold memories.

DETAILED DESCRIPTION OF THE INVENTION

Figure 1:
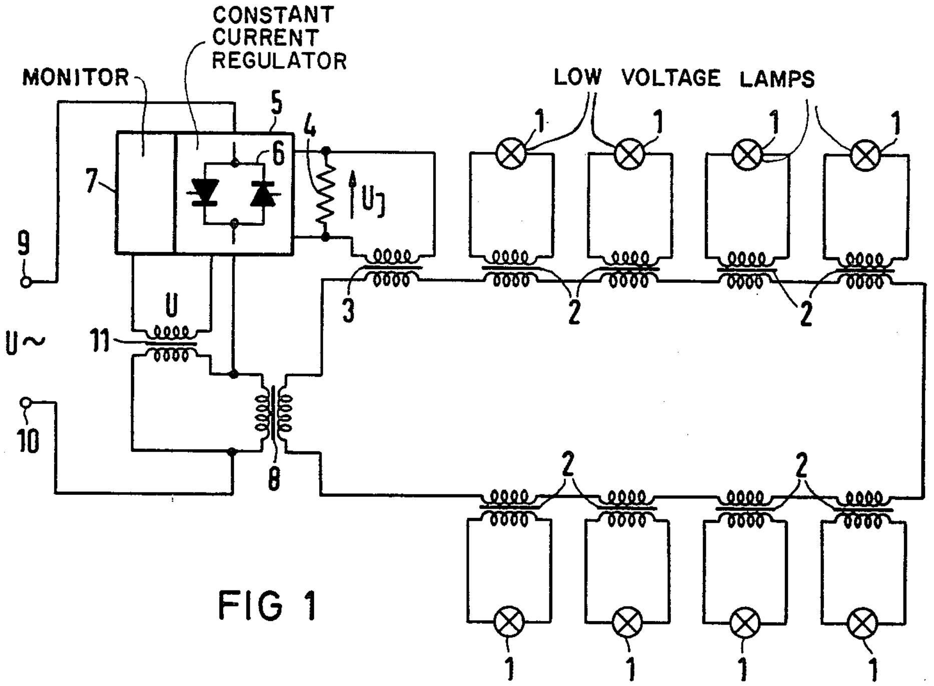
FIG. 1 is a schematic diagram of an airport landing-light system.

In FIG. 1, the circuit diagram of an airport landing-light system is shown. Low-voltage lamps 1 are used for this purpose, each lamp being supplied by the secondary side of current transformers 2 which are connected in series on the primary side. To measure the current I flowing in this circuit, a current measuring transformer 3 is used which feeds a load 4 on its secondary side, so that a current-proportional measuring voltage $U_I$ appears across it. The measuring voltage $U_I$ is fed to a block 5 which contains a constant-current regulator 6 as well as a monitoring device 7 for the lamp failures. Current transformers 2 are fed by the secondary side of a high-voltage transformer 8. High-voltage transformer 8 is connected, on its primary side, to terminals 9 and 10 of the AC supply network via constant-current regulator 6. The voltage on the primary side of high-voltage transformer 8 is determined by a voltage measuring transformer 11 of which the output voltage U is fed to block 5.

Figure 2:
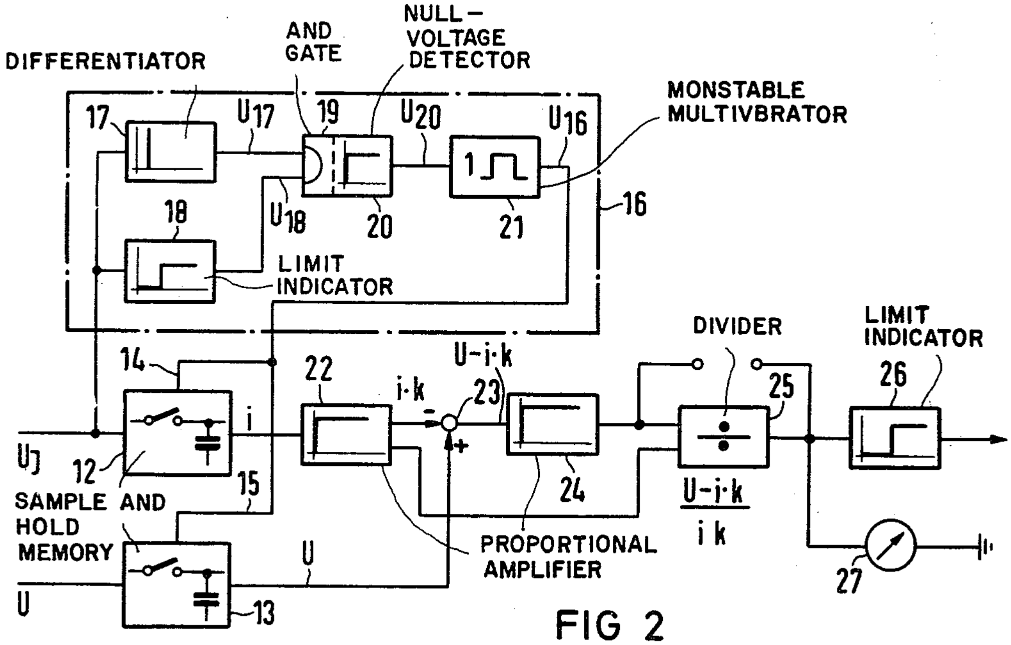
FIG. 2 is a block diagram illustrating an embodiment of a monitoring device according to the teachings of the invention.

FIG. 2 is a block diagram of an illustrative embodiment of monitoring device 7, in accordance with the invention. Here, the output signal $U_I$ of current measuring transformer 3 is fed to the input of a first sample-and-hold memory 12. The output signal U of voltage measuring transformer 11 is applied to the input of a second sample-and-hold memory 13.

Sample-and-hold memories 12 and 13 are activated, via the lines 14 and 15, by the output signal $U_{16}$ of the maximum-value detector 16 at time of occurrence of the maximum of current I. To this end, the input of maximum-value detector 16 is fed the measuring voltage $U_I$ from current measuring transformer 3, representing the current I; there it is applied, in parallel, to a differentiating stage 17 and to a limit indicator stage 18. The output signals $U_{17}$ and $U_{18}$ of these stages are conjunctively linked in an AND gate 19, and fed to a null-voltage detector 20. If a positive output signal $U_{18}$ of the limit indicator 18 is present, null detector 20 delivers a zero signal for the remaining time that the output signal of limit indicator 18 is positive after a zero crossing of the voltage $U_{17}$. The trailing edge of an output pulse from null-voltage detector 20 triggers and edge-triggered monostable multivibrator 21 which is connected thereto and which supplies the pulse-shaped activating signal $U_{16}$ to sample-and-hold memories 12 and 13.

Figure 3:
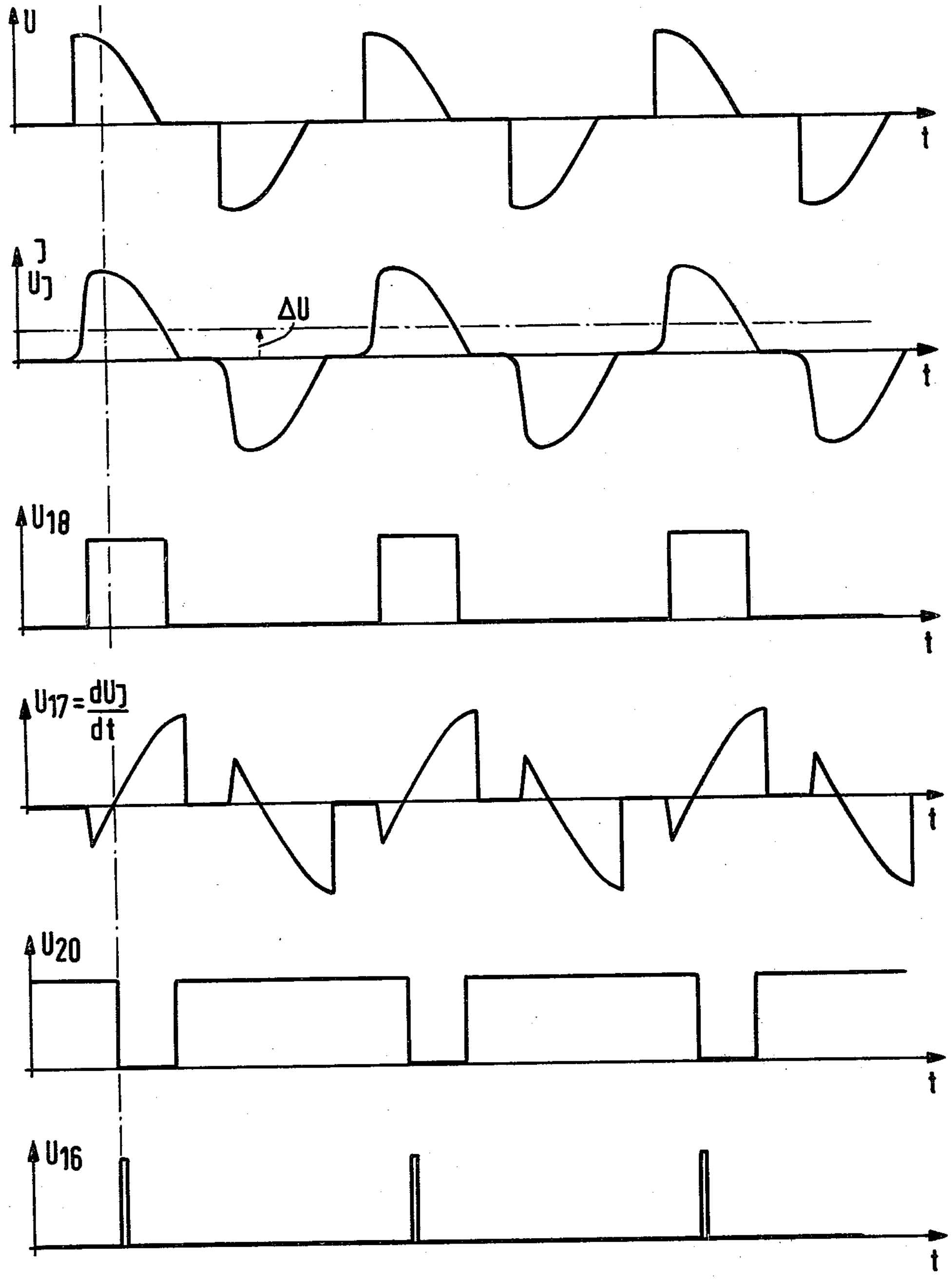
FIG. 3 is a chart showing the character and relationship of signals in the circuit of FIG. 2.

The operation of maximum detector 16 will be explained in the following, referring to the pulse diagram of FIG. 3. The very top diagram shows the voltage U, which is present at the output of voltage measuring transformer 11 due to the phase-gating control of constant-current regulator 6. Below it is plotted the qualitative wave-form of the corresponding current I through current transformer 3 and the corresponding voltage signal $U_I$ which is present at the load resistor of current transformer 3. Further down in FIG. 3 is illustrated the output signal $U_{18}$ of limit indicator 18. Limit detector 18 responds and delivers a high signal when the voltage $U_I$, present at the input, exceeds the level U shown by the interrupted line. The next curve in FIG. 3 shows output voltage $U_{17}$ of differentiating stage 17. The output voltage $U_{20}$ of the null-voltage detector 20 changes at each zero crossing of the voltage $U_{17}$, when a high signal from limit indicator 18 is present as already mentioned above, from a high signal to a low signal. It stays there for the remaining time that voltage $U_{18}$ stays high, even if the current I decreases continuously after a current maximum has occurred. The mono-stable multivibrator 21 is triggered by the trailing edge of the voltage $U_{20}$, in the transition from high to low of the null-voltage detector, and delivers a pulse-shaped signal $U_{16}$ for controlling sample-and-holds 12 and 13. As can be seen from FIG. 3, a pulse-shaped signal $U_{16}$ occurs only at each maxiumum of the current I. At the minimum of current I, at which a zero crossing of the output voltage $U_{17}$ of differentiating stage 17 likewise takes place, no "on" pulse for the two sample-and-hold memories 12 and 13 is generated, due to the influence of limit indicator 18 and the conjunctive linkage of signals $U_{17}$ and $U_{18}$.

The design of the illustrative embodiment of a monitoring device according to the invention will be explained further in the following, with reference to the block diagram of FIG. 2. The output signal i of first sample-and-hold memory 12 is fed to a first, adjustable, proportional amplifier 22, the output signal $i \times k$ of which is subtracted at the summing junction 23 from the output voltage U of second sample-and-hold memory 13. Thereby, the voltage $(U-i\times k)$ is produced at the summing junction 23. This voltage is fed to the input of a second, adjustable, proportional amplifier 24, the output signal of which is applied to one input of a divider 25. The second input of divider 25 is fed the output signal of first adjustable proportional amplifier 22, so that the quotient $(U-i\times k)/i\times k$ is formed. This signal represents the percentage of failed lamps and its level is displayed by limit indicator 26 and is indicated at indicating instrument 27.

This will be illustrated by means of a simple mathematical consideration. If, as assumed, the current and the voltage are measured at the maximum of the current, the components of the impedance due to the inductances can be ignored, so that the determination of the percentage A of failed lamps 1 is reduced to determining ohmic resistances. Thus, we have for the percentage A of failed lamps:

$$A=(R_0-R_1)R_0,$$

where $R_0$=resistance of the intact circuit, $R_1$=resistance of the circuit with failed lamps.

Thus, we have: $A=1-R_1/R_0=1-R_1/\text{const}=1-U/(i\times k)$. From this follows:

$$A=(i\times k-U)/(i\times k).$$

The factor k can be adapted by setting the gain of the first adjustable proportional amplifier 22 in every brightness step so that the term $(U-i\times k)$ becomes zero. It is achieved thereby that for the same number of failed lamps, always the same indication is obtained, regardless of the brightness level that is set.

Figure 4:
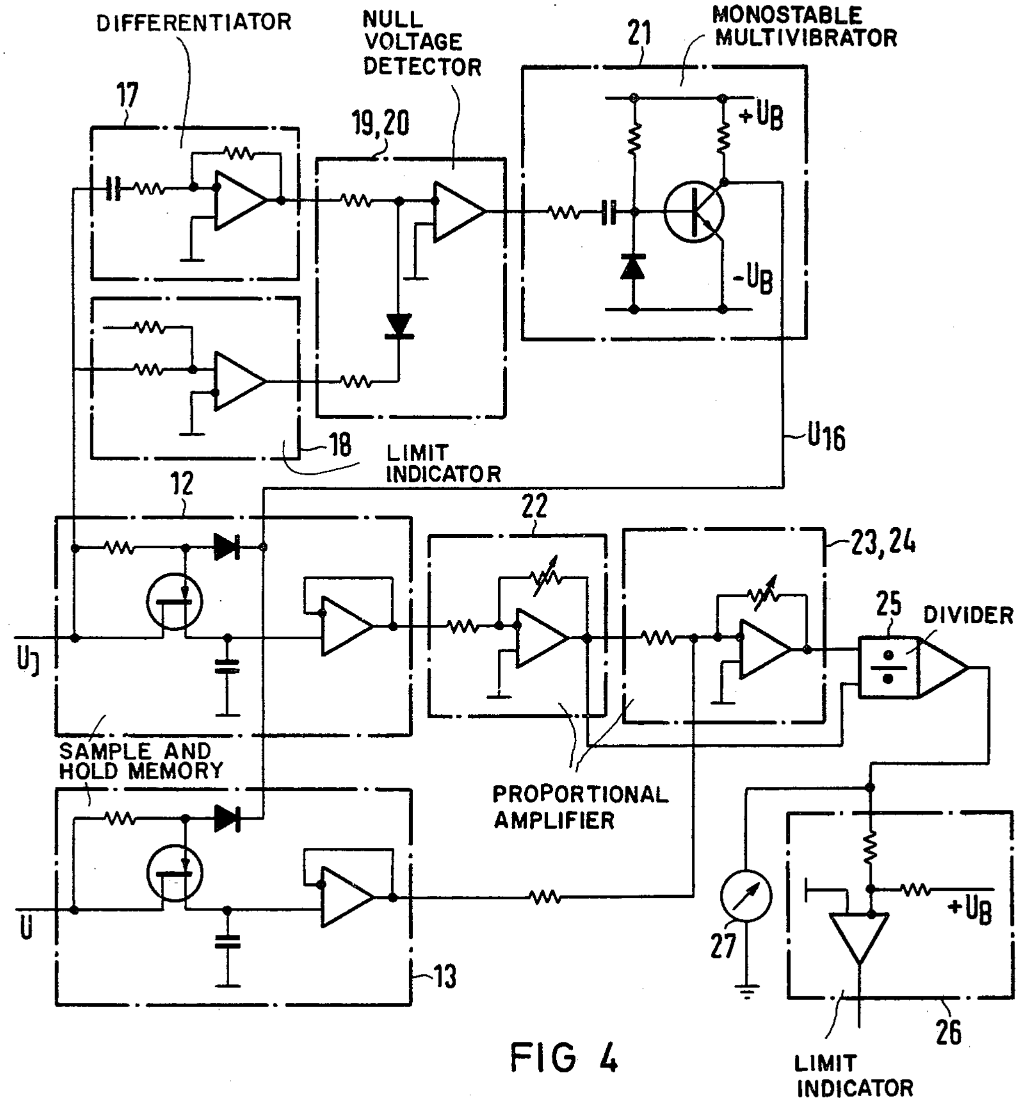
FIG. 4 is a schematic diagram showing details of the circuit of FIG. 2.

In FIG. 4, a concrete realization of the circuit shown in the block diagram of FIG. 2 using discrete components is given. The discrete components which are associated and form a block are outlined in dashed boxes.

Thus, sample-and-hold memories 12 and 13 comprise transistors, which are gated by pulses $U_{16}$, each of which charges a capacitor to hold the sampled voltage and current values until the next measurement cycle. Differentiating stage 17 has its input $U_I$ from current measuring transformer 3, coupled through a differentiating capacitor and produces voltage $U_{17}$. Limit indicator stage 18 is an open loop amplifier which becomes conductive when the same input signal $U_I$ exceeds the predetermined level $\Delta U$, yielding voltage pulses $U_{18}$ of constant amplitude and varying length. AND gate 19 conjunctively links signals $U_{17}$ and $U_{18}$ to the input of null-voltage detector 20, with signal $U_{18}$, coupled through a blocking diode, serving to gate the open loop amplifier which forms detector 20. Detector 20 is thus limited to a response time coinciding with the positive-going transition of the voltage $U_{17}$ which occurs at the peak of current $U_I$. When $U_{17}$ crosses the zero line, the null is detected, and the output $U_{20}$ of null detector 20 goes to zero. The negative-going edge of this signal triggers one-shot multivibrator 21, which thus generates pulse voltage $U_{16}$ each time the input circuit signal $U_I$ peaks. This gate signal $U_{16}$ is applied, through series connected diodes to momentarily turn on each sampling gate transistor and thus charge the associated sampling capacitor. The voltage on each sampling capacitor is made available at the output of an amplifier as the remembered signal i or U.

The current signal i from sample-and-hold memory 12 is amplified and inverted in an amplifier 22 having a variable gain loop and fed to summing junction 23 at the input to proportional amplifier 24, where it is combined with the voltage signal sample U from memory 13. By adjustment of the gain of proportional amplifier 22, the signals combined at summing junction 23 can be caused to offset each other, resulting in application of a zero signal to one input of divider 25. When the input to divider 25 is zero, there is a zero indication at meter 27, and no output from limit indicator 26. When there is an output divider 25, the sensitivity of meter 27 and level at which limit indicator 26 responds may be established, or calibrated, by controlling the gain of proportional amplifier 24.

What is claimed is:

1. A device for monitoring lamp failures in an airport landing light system comprising:
- a plurality of lamps each of which is supplied by a current transformer;
- a high voltage transformer having a primary winding connected to an AC network via a constant current regulator and a secondary winding connected in series with the series-connected primary windings of the current transformers;
- a current measuring transformer connected for measuring the current flowing in the primary windings of the current transformers;
- a voltage measuring transformer for measuring the voltage on the primary winding of the high voltage transformer;
- means for monitoring and indicating the percentage of failed lamps comprising a first sample-and-hold memory connected to the output of the current measuring transformer and a second sample-and-hold memory connected to the output of the voltage measuring transformer;
- an extreme value detector for activating the sample-and-hold memories upon the occurrence of an extreme value in the output signal of the current measuring transformer;
- a first proportional amplifier connected to the output of the first sample-and-hold memory;
- means for taking the difference between the output of the second sample-and-hold memory and the first proportional amplifier and supplying it to a second proportional amplifier;
- means for dividing the output of the second proportional amplifier by the output of the first proportional amplifier; and
- means responsive to the output of the dividing means for indicating the condition of the lamps.

2. The monitoring device of claim 1 in which the extreme-value detector is a peak value detector.

3. The monitoring device of claim 2 in which the input to the maximum-value detector comprises a differentiating stage and a limit detector, connected in parallel, the output signals of which are fed, conjunctively linked, to a null voltage detector and a monostable multivibrator controlled by the null voltage detector, for activating the sample-and-hold memories.

4. A method for setting the null point of a lamp condition indicating means, for different brightness levels, in a device for monitoring lamp failures having:
- a plurality of lamps each of which is supplied by a current transformer;
- a high voltage transformer having a primary winding connected to an AC network via a constant current regulator and a secondary winding connected in series with the series-connected primary windings of the current transformers;
- a current measuring transformer connected for measuring the current flowing in the primary windings of the current transformers;
- a voltage measuring transformer for measuring the voltage on the primary winding of the high voltage transformer;
- means for monitoring and indicating the percentage of failed lamps comprising a first sample-and-hold memory connected to the output of the current measuring transformer and a second sample-and-hold memory connected to the output of the voltage measuring transformer;
- an extreme value detector for activating the sample-and-hold memories upon the occurrence of an extreme value in the output signal of the current measuring transformer;
- a first proportional amplifier connected to the output of the first sample-and-hold memory;
- means for taking the difference between the output of the second-and-hold memory and the first proportional amplifier and supplying it to a second proportinal amplifier;
- means for dividing the output of the second proportional amplifier by the output of the first proportional amplifier; and
- means responsive to the output of the dividing means for indicating the condition of the lamps;
- the method comprising adjusting the gain of the first proportional amplifier for each brightness level, with lamps intact, so that the difference between the output signals of the second sample-and-hold memory and the first proportional amplifier becomes zero.

5. A method for setting the null point of the lamp condition indicating means, for different brightness levels, in a device for monitoring lamp failures having:

a plurality of lamps each of which is supplied by a current transformer;

a high voltage transformer having a primary winding connected to an AC network via a constant current regulator and a secondary winding connected in series with the series-connected primary windings of the current transformers;

a current measuring transformer connected for measuring the current flowing in the primary windings of the current transformers;

a voltage measuring transformer for measuring the voltage on the primary winding of the high voltage transformer;

means for monitoring and indicating the percentage of failed lamps comprising a first sample-and-hold memory connected to the output of the current measuring transformer and a second sample-and-hold memory connected to the output of the voltage measuring transformer;

maximum value detector for activating the sample-and-hold memories upon the occurrence of an extreme value in the output signal of the current measuring transformer;

a first proportional amplifier connected to the output of the first sample-and-hold a memory;

means for taking the difference between the output of the second sample-and-hold memory and the first proportional amplifier and supplying it to a second proportional amplifier;

means for dividing the output of the second proportional amplifier by the output of the first proportional amplifier; and means responsive to the output of the dividing means for indicating the condition of the lamps, the method comprising adjusting the gain of the first proportional amplifier for each brightness level, with lamps intact, so that the difference between the output signals of the second sample-and-hold memory and the first proportional amplifier becomes zero.

6. A method for setting the null point of the lamp condition indicating means, for different brightness levels, in a device for monitoring lamp failures having:

a plurality of lamps each of which is supplied by a current transformer;

a high voltage transformer having a primary winding connected to an AC network via a constant current regulator and a secondary winding connected in series with the series-connected primary windings of the current transformers;

a current measuring transformer connected for measuring the current flowing in the primary windings of the current transformers;

a voltage measuring transformer for measuring the voltage on the primary winding of the high voltage transformer;

means for monitoring and indicating the percentage of failed lamps comprising a first sample-and-hold memory connected to the output of the current measuring transformer and a second sample-and-hold memory connected to the output of the voltage measuring transformer;

a maximum value detector for activating the sample-and-hold memories upon the occurrence of a maximum value in the output signal of the current measuring transformer, the maximum value detector comprising a differentiating and a limit indicator stage both of which are fed by the current transformer output signal and the output signals of which are conjunctively coupled to a null-voltage detector which feeds a monostable multi-vibrator for activating the sample-and-hold memories;

a first proportional amplifier connected to the output of the first sample-and-hold memory;

means for taking the difference between the output of the second sample-and-hold memory and the first proportional amplifier and supplying it to a second proportional amplifier;

means for dividing the output of the second proportional amplifier by the output of the first proportional amplifier; and means for responsive to the output of the dividing means for indicating the condition of the lamps, the method comprising adjusting the gain of the first proportional amplifier for each brightness level, with lamps intact, so that the difference between the output signals of the second sample-and-hold memory and the first proportional amplifier becomes zero.

* * * * *